United States Patent
Sterna et al.

(10) Patent No.: US 11,621,648 B2
(45) Date of Patent: Apr. 4, 2023

(54) CIRCUIT FOR CONTROLLING TWO SWITCHES ELECTRICALLY IN SERIES

(71) Applicant: Commissariat à l'Energie Atomique et aux Energies Alternatives, Paris (FR)

(72) Inventors: Léo Sterna, Grenoble (FR); Pierre Perichon, Grenoble (FR)

(73) Assignee: Commissariat à l'Energie Atomique et aux Energies Alternatives, Paris (FR)

(*) Notice: Subject to any disclaimer, the term of this patent is extended or adjusted under 35 U.S.C. 154(b) by 131 days.

(21) Appl. No.: 17/247,470

(22) Filed: Dec. 11, 2020

(65) Prior Publication Data
US 2021/0184592 A1 Jun. 17, 2021

(30) Foreign Application Priority Data
Dec. 13, 2019 (FR) ...................... 1914394

(51) Int. Cl.
*H02M 7/219* (2006.01)
*H02M 1/08* (2006.01)
*H02M 1/38* (2007.01)
*H02M 1/32* (2007.01)

(52) U.S. Cl.
CPC ............ *H02M 7/219* (2013.01); *H02M 1/08* (2013.01); *H02M 1/32* (2013.01); *H02M 1/38* (2013.01)

(58) Field of Classification Search
CPC ....... H02M 1/32; H02M 1/38; H03K 17/0822
See application file for complete search history.

(56) References Cited

U.S. PATENT DOCUMENTS

| | | | | |
|---|---|---|---|---|
| 4,827,934 A | * | 5/1989 | Ekwall | A61N 1/36514 607/9 |
| 4,967,138 A | * | 10/1990 | Obergfell | H02M 3/1582 323/271 |
| 5,097,403 A | * | 3/1992 | Smith | H02M 3/158 363/127 |
| 6,011,707 A | * | 1/2000 | Mine | H02M 1/4225 363/60 |
| 8,711,593 B2 | * | 4/2014 | Ho | H03K 17/06 363/126 |
| 2002/0135235 A1 | | 9/2002 | Winick et al. | |
| 2002/0158615 A1 | * | 10/2002 | Goodfellow | G01R 19/16519 323/315 |
| 2004/0135618 A1 | * | 7/2004 | Peron | H05B 39/08 327/403 |
| 2007/0007912 A1 | * | 1/2007 | Yang | H02M 1/32 315/291 |

(Continued)

FOREIGN PATENT DOCUMENTS

FR 2866492 A1 8/2005

OTHER PUBLICATIONS

Preliminary Search Report for French Application No. 1914394 dated Aug. 4, 2020, 2 pages.

*Primary Examiner* — Gustavo A Rosario-Benitez
(74) *Attorney, Agent, or Firm* — Moreno IP Law LLC (57) ABSTRACT

The present disclosure concerns a circuit (302) for controlling two switches (210-1, 210-2) electrically in series, including sensors (310-1, 310-2) of voltages across the switches and a circuit (310) of comparison of signals output by said sensors, one at least of said sensors being an active circuit.

14 Claims, 5 Drawing Sheets

(56) References Cited

U.S. PATENT DOCUMENTS

| | | | |
|---|---|---|---|
| 2007/0216474 A1* | 9/2007 | Kitao | H03H 11/126 327/554 |
| 2008/0204958 A1* | 8/2008 | Shearon | H02H 3/18 361/93.9 |
| 2009/0052096 A1* | 2/2009 | Takahashi | H02M 1/08 361/18 |
| 2014/0043871 A1* | 2/2014 | Shen | H02M 1/12 363/40 |
| 2014/0139268 A1* | 5/2014 | Bayerer | H03K 17/063 327/109 |
| 2018/0166971 A1* | 6/2018 | Pidutti | H01L 29/7813 |
| 2018/0198380 A1* | 7/2018 | Sterna | H02M 7/219 |
| 2020/0195247 A1* | 6/2020 | Kaya | H03K 17/145 |

\* cited by examiner

Fig. 7

CIRCUIT FOR CONTROLLING TWO SWITCHES ELECTRICALLY IN SERIES

FIELD

The present disclosure generally concerns electronic devices, in particular, switched-mode converters.

BACKGROUND

Switched-mode converters use one or a plurality of switches alternately set to the on and off states at a switching frequency. Switched-mode converters are used to output a voltage and/or a current based on a power supply having voltage/current values different from the values of the voltage/current to be output. For example, an AC-DC ("alternating-direct") switched-mode converter enables to obtain a DC voltage from an AC voltage such as that of an electric network or of an alternator.

SUMMARY

There is a need to decrease the bulk of known converters.

There is a need to increase the power efficiency and to decrease the heating of known converters.

An embodiment overcomes all or part of the disadvantages of known switch control circuits.

An embodiment overcomes all or part of the disadvantages of known switch control methods.

An embodiment overcomes all or part of the disadvantages of known converters.

An embodiment provides a circuit for controlling switches of a converter enabling the converter to have a lower heating and a higher power efficiency than those of known converters.

An embodiment provides a circuit for controlling two switches electrically in series, comprising sensors of voltages across the switches and a circuit of comparison of signals output by said sensors, one at least of said sensors being an active circuit.

According to an embodiment, the circuit is capable of delivering a control signal, according to a result output by the comparison circuit, to a control terminal common to said switches.

According to an embodiment, the circuit is configured to switch the control signal from a first level to a second level when a state change of said result occurs.

According to an embodiment, the circuit is configured to:
receive an additional signal;
maintain the control signal at the first level between said reception and said state change; and
maintain the control signal at the second level between said state change and a reception of another additional signal.

According to an embodiment, said voltages are across the respective switches, and said sensors are two active circuits having a same relationship between the input and the output.

According to an embodiment, said relationship comprises a constant offset.

According to an embodiment, said switches comprise field-effect transistors of the same type having a common source terminal, the transistors preferably being of GaN HEMT type.

According to an embodiment, the signals output by said sensors are referenced to the potential of the common source terminal.

According to an embodiment, each sensor comprises:
an amplifier having a non-inverting input coupled to a first node of application of a potential fixed with respect to the potential of the common source terminal;
a first resistor coupling an inverting input of the amplifier to a drain terminal of one of said transistors; and
a second resistor coupling the inverting input to an output of the amplifier and, preferably, a capacitor electrically in parallel with the second resistor.

According to an embodiment, the first node is common to the sensors or the first nodes are distinct, the or each first node connects third and fourth resistors electrically in series between the common source terminal and a second node of application of an additional voltage referenced to the common source terminal, and, preferably, the amplifier and/or the comparison circuit are powered with said additional voltage.

An embodiment provides a method of controlling two switches electrically in series, implemented by a circuit such as defined hereabove.

According to an embodiment, the method comprises the outputting of said signals by said sensors and the comparison of said signals with each other by said comparison circuit.

An embodiment provides an integrated circuit comprising one or a plurality, preferably two or four, circuits such as defined hereabove.

An embodiment provides a device comprising a circuit such as defined hereabove or an integrated circuit such as defined hereabove, and said switches.

An embodiment provides a switched-mode converter comprising one or a plurality of devices such as defined hereabove.

According to an embodiment, the converter is configured to receive and/or output an AC voltage, comprising two bidirectional switches, each formed of two switches of one of said devices, the two bidirectional switches being electrically in series between two nodes of application of the AC voltage.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, a driver circuit, provided to apply a control signal to a bidirectional switch, is not described in detail, the described embodiments being compatible with usual driver circuits.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Unless specified otherwise, ordinal numerals such as "first", "second", etc. are only used to distinguish elements from one another. In particular, these adjectives do not limit the described devices and methods to a specific order of these elements.

Figure 1:
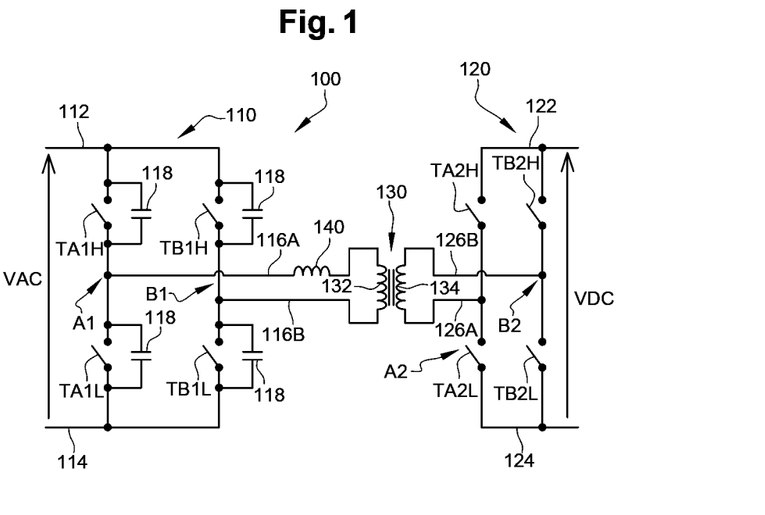
FIG. 1 schematically shows an example of a switched-mode converter of a type to which the described embodiments apply.

FIG. 1 schematically shows an example of a switched-mode converter 100 of a type to which the described embodiments apply. In this specific example, converter 100 is identical or similar to the converters described in patent application EP3346598 (B15653-DD17624).

Converter 100 is an AC-DC-type converter receiving an AC voltage VAC and outputting a DC voltage VDC. In a typical application, AC voltage VAC originates from an electric distribution network, and for example has a rms voltage in the order of 110 V or of approximately 230 V, and for example a frequency equal to 50 Hz or 60 Hz. AC voltage VAC is thus preferably a high voltage, that is, having a peak value greater than 100 V, preferably greater than 300 V, for example, equal to approximately 450 V or to approximately 600 V.

The DC voltage is typically used to charge a battery, for example, a battery of a laptop computer or of a mobile distant communication device such as a cell phone. In an application, the DC voltage is delivered via a connection according to the universal serial bus USB standard, for example, of type C, preferably to the power delivery PD standard. DC voltage VDC then is 5 V, 12 V, or 20 V. The delivered power may then range up to 100 W. In other applications, the battery is that of an inverter, for example, of the type used in data centers. The power may then be greater than 1 kW, for example, approximately 1.5 kW.

Converter 100 comprises four switches TA1H, TA1L, TB1H, TB1L, for example identical to within manufacturing dispersions. Switches TA1H, TA1L, TB1H, TB1L are connected to form a first H bridge 110. The first H bridge 110 comprises two branches A1 and B1 coupling nodes 112 and 114 of application of AC voltage VAC. Branch A1 comprises switches TA1H and TA1L electrically in series between nodes 112 and 114. Branch B1 comprises switches TB1H and TB1L electrically in series between nodes 112 and 114.

Switches TA1H and TB1H are located on the side of node 112 and switches TA1L and TB1L are located on the side of node 114. H bridge 110 comprises a node 116A of connection between switches TA1H and TA1L and a node 116B of connection between switch TB1H and TB1L. First H bridge 110 further comprises, electrically in parallel with each switch TA1H, TA1L, TBAH, TB1L, a capacitive element 118. Capacitive elements 118 may be capacitors or, for example, capacitances internal to the switches, such as capacitances appearing between semiconductor regions of each switch.

Converter 100 further comprises four switches TA2H, TA2L, TB2H, TB2L, for example identical to within manufacturing dispersions. Switches TA2H, TA2L, TB2H, TB2L are connected to form a second H bridge 120. Second H bridge 120 comprises two branches A2 and B2 coupling nodes 122 and 124 for outputting DC voltage VDC. Branch A2 comprises switches TA2H and TA2L electrically in series between nodes 122 and 124. Branch B2 comprises switches TB2H and TB2L electrically in series between nodes 122 and 124. Switches TA2H and TB2H are located on the side of node 122 and switches TA2L and TB2L are located on the side of node 124. H bridge 120 comprises a node 126A of connection between switches TA2H and TA2L and a node 126B of connection between switches TB2H and TB2L.

Converter 100 further comprises a transformer 130. Transformer 130 has a first winding 132 electrically in series with an inductance 140 between nodes 116A and 116B of first H bridge 110. Transformer 130 has a second winding 134 coupling, preferably connecting, nodes 126A and 126B of second H bridge 120. As a variant, first winding 132 connects nodes 116A and 116B and inductance 140 is in series with second winding 134 between nodes 126A and 126B.

In operation, the AC voltage successively takes positive (potential of node 112 greater than that of node 114) and negative (potential of node 112 smaller than that of node 114) values. To ensure this operation, switches TA1H, TA1L, TB1H, TB1L are bidirectional for the voltage. A switch bidirectional for the voltage is defined by a switch capable, in an off state, of preventing the flowing of a current for both directions of the voltage across the switch. Further, the current flowing through inductance 140 is also alternating. For this purpose, the switches are bidirectional for the current. A switch bidirectional for the current is defined by a switch capable, in an on state, of allowing the flowing of a current in both directions. Thus, switches TA1H, TA1L, TB1H, TB1L are bidirectional for the voltage and the current.

In an example of operation, at a switching frequency, in alternation, switches TA1H and TB1L are turned on and TB1H and TA1L are turned off, and then TA1H and TB1L are turned off and TB1H and TA1L are turned on. This example is not limiting, the methods of controlling the various switches of converter 100 to obtain, due to the switching, voltage VDC from voltage VAC are not described in detail, the described embodiments being compatible with usual methods of controlling switched-mode AC-DC converter switches. The switching frequency is higher than that of AC voltage VAC, preferably greater than 1 MHz.

In converter 100, to avoid energy losses between TA1H, TA1L, TB1H, TB1L during switchings between the on state and the off state, each switching between the off state and the on state of a switch TA1H, TA1L, TB1H, TB1L is performed when the voltage across the switch becomes zero, or becomes substantially zero as compared with the peak value of voltage VAC. Such switchings are called zero volt switchings ZVS.

The example of converter 100 described hereabove is not limiting. In particular, the described embodiments are applicable to any converter similar to converter 100 intended to receive and/or output an AC voltage. The described embodiments are also applicable to any switched-mode converter, in particular to any converter intended to receive and/or output a voltage having different successive signs, preferably a single-phase or multiphase AC voltage. In particular, the embodiments are applicable to any converter comprising one or a plurality of branches between two nodes of application of the AC voltage. Each branch then comprises at least two switches in series. The branches typically deliver a current to an inductance internal to the converter. Preferably, the switches of each branch are controlled in ZVS, and, more preferably, these switches are bidirectional. Bidirectional means bidirectional for the current and/or the voltage.

Figure 2:
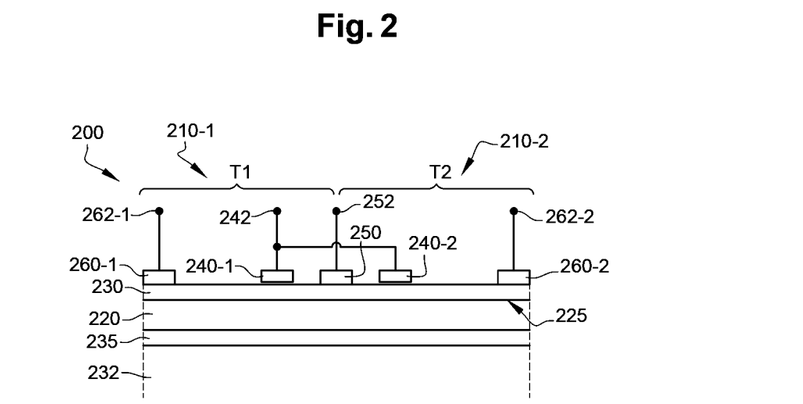
FIG. 2 shows, in a simplified cross-section view, an example of a bidirectional switch of a type to which the described embodiments apply.

FIG. 2 shows, in a simplified cross-section view, an example of a bidirectional switch 200 of a type to which the described embodiments apply. Bidirectional switch 200 may form any bidirectional switch of a switched-mode converter. For example, the switches TA1H, TB1H, TA1L, and TB1L of the converter 100 of FIG. 1 are each identical or similar to bidirectional switch 200.

Bidirectional switch 200 comprises two switches 210-1 and 210-2 electrically in series. Preferably, switches 210-1 and 210-2 comprise respective field-effect transistors T1 and T2. Transistors T1 and T2 may then be of any field-effect type. However, preferably, transistors T1 and T2 are of the shown type, called high electron mobility transistor, HEMT. Such transistors comprise two semiconductor layers 220 and 230 in contact with each other, semiconductor layers 220 and 230 then defining together an interface 225. The electrons are mobile along interface 225. Such a transistor enables to block higher voltages and allows faster switchings than other types of field-effect transistors. More preferably, the semiconductors of layers 220 and 230 respectively are gallium nitride (GaN) and aluminum-gallium nitride (AlGaN). It is then spoken of a GaN HEMT-type transistor.

Layers 220 and 230 typically rest on a support 232. Support 232 is for example a portion of a semiconductor wafer such as a silicon wafer. Support 232 may be covered with buffer layers 235 located between support 232 and layer 220, intended to ease the forming of layer 230 on support 232. Various elements, such as insulating regions, as well as materials other than those described hereabove, and dimensions such as the layer thicknesses, are not detailed herein, the described embodiments being compatible with usual GaN HEMT transistors.

Although, in the shown example, each switch 210-1, 210-2 comprises one transistor only, respectively T1, T2, switch 210-1 may comprise a plurality of transistors T1 electrically in parallel with one another, and switch 210-2 may comprise a plurality of transistors T2 electrically in parallel with one another.

Preferably, a plurality of bidirectional switches 200 are located on the same support 232. The bidirectional switches are for example four switches of an H bridge. Such an H bridge, formed inside and/or on top of a same support, is called monolithic. The switches of the H bridge are then preferably located in a same integrated circuit package. Integrated circuit package means an assembly, preferably tight, having areas of connection or pins of connection to electronic circuits external to the circuit, for example, to a printed circuit board PCB, jutting out of it. As a variant, the switches are inside and/or on top of different supports, for example, in a same package. In another variant, the switches of each H bridge branch are in a same package.

Transistors T1 and T2 each comprise a gate, respectively 240 1, 240 2, and a drain region, respectively 260 1, 260 2. Transistors T1 and T2 each comprise a terminal, respectively 262 1, 262 2 coupled, preferably connected, to the drain region, respectively 260 1, 260 2. In the shown example, the gates and the drain regions are located on layer 230.

Preferably, bidirectional switch 200 comprises a source terminal 252 common to transistors T1 and T2, connected to a source region 250 common to transistors T1 and T2. In the shown example, the common source region is located on layer 230. In each transistor T1, T2, the gate, respectively 240-1, 240-2 is located between the drain region, respectively 260-1, 260-2, and common source region 250. In a variant, source terminal 252 is coupled, for example, connected, to distinct source regions in transistors T1 and T2. In another variant, transistors T1 and T2 have distinct source terminals.

Each transistor T1, T2 is configured so that, when a positive voltage is applied between the drain and the source of the transistor, the on/off state of the transistor is controlled by the voltage between the gate and the source of the transistor. Thus, in particular when the voltage takes high values such as defined hereabove, the most part of this voltage is between the drain and the gate.

Preferably, bidirectional switch 200 comprises a common terminal 242 coupled, preferably connected, to the gates 240-1 and 240-2 of transistors T1 and T2. Common terminal 242 forms a control terminal of bidirectional switch 200. As a variant, bidirectional switch 200 has, for each switch 210-1, 210-2, a distinct control terminal coupled, preferably connected, to the concerned gate. However, as compared with such a variant, the common terminal has the advantage of requiring a single signal to control the on or off state of the bidirectional switch, which simplifies the bidirectional switch control method.

Preferably, as shown, the structures of switches 210-1 and 210-2 formed by layers 220 and 230, the gates, and the drain and source regions, are symmetrical to each other with respect to a plane or with respect to an axis running through the common source region. Symmetrical means symmetrical to within manufacturing dispersions. This enables, as compared with non-symmetrical switches 210-2 and 210-2, to obtain more easily inside and/or on top of a same support 232 a plurality of bidirectional switches 200 with a common source region having identical electric characteristics.

Figure 3:
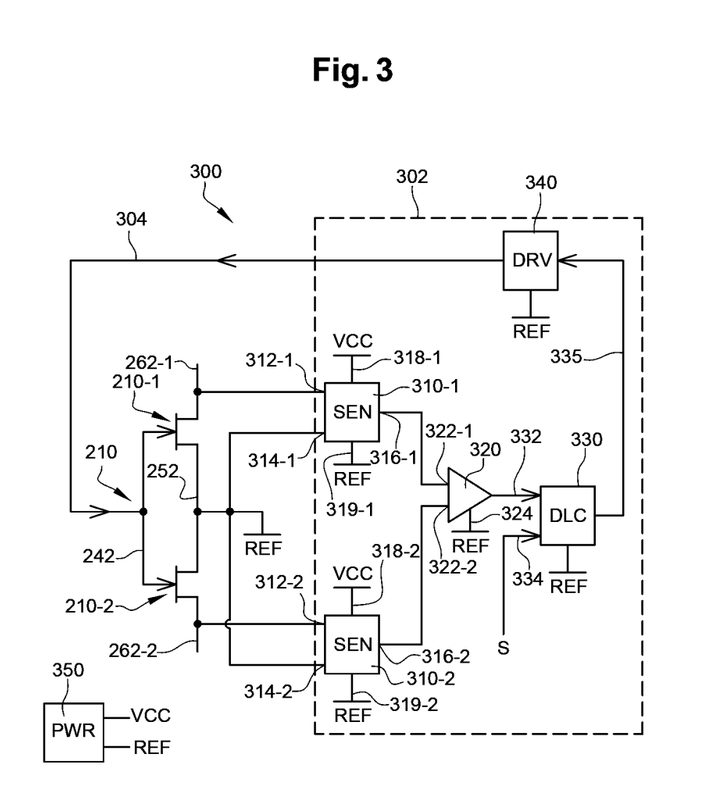
FIG. 3 schematically shows an embodiment of a device comprising a control circuits and switches electrically in series.

FIG. 3 schematically shows an embodiment of a device 300 comprising a control circuit 302 and switches electrically in series controlled by control circuit 302. A converter such as described in relation with FIG. 1 may comprise a plurality of devices 300. For each device 300, the switches in series then preferably form a bidirectional switch of the converter. For example, these bidirectional switches form the respective switches TA1H, TB1H, TA1L, and/or TB1L of a converter of the type of the converter 100 of FIG. 1. Each device 300 then receives a control signal S representative of a desired state of the concerned switch. Control signals S are then different for the different devices 300. Preferably, the switches in series of device 300 are identical or similar to the switches 210-1 and 210-2 of a bidirectional switch 200 of the type described in relation with FIG. 2.

In the shown example, control circuit 302 is coupled, preferably connected, to the common control and source terminals 242 and 252, and to drain terminals 262-2 and 262-1. Circuit 302 outputs a control signal 304 applied to the control terminal 242 of switches 210-1 and 210-2. In variants, control circuit 302 is coupled, preferably connected, to distinct control terminals and to the conduction terminals of the two switches. Conduction terminals means the terminals placed in conduction with each other in the on state of the transistor, that is, in the case of a field-effect transistor, the source and drain terminals. Thus, in a variant, switches 210-1 and 210-2 have distinct control terminals, and circuit 302 applies a control signal to each of switches 210-1 and 201-2.

Control circuit 302 comprises, for each switch 210-1, 210-2, a voltage sensor (SEN), respectively 310-1 and 310-2, capable of sensing, or measuring, the voltage across the concerned switch. More particularly, sensor 310 1 has inputs 312 1 and 314 1 coupled, preferably connected, to the conduction terminals of switch 210 1. In the shown example, sensor 310 1 has its inputs 312 1 and 314 1 coupled, preferably connected, respectively to the drain 262 1 and common source 252 terminals. Similarly, sensor 310 2 has inputs 312 2 and 314 2 coupled, preferably connected, to the conduction terminals of switch 210 2. In the shown example, sensor 310-2 has its inputs 312-2 and 314-2 coupled, preferably connected, respectively to drain 262-2 and common source 252 terminals.

Each sensor 310 1, 310 2 is capable of delivering on an output, respectively 316 1, 316 2, a signal representative of the voltage between the conduction terminals of the switch. Preferably, this representative signal has the shape of a voltage. As a variant, the signal output by each sensor 310 has a level varying continuously within a range for example from 0 to 3.3 V, or for example in the range from 0 to 5.5 V, when the voltage across the considered switch varies during the converter operation.

Control circuit 302 comprises a comparison circuit 320. Comparison circuit 320 has two inputs 322 1 and 322 2 coupled, preferably connected, to the respective outputs 316 1 and 316 2 of respective sensors 310 1 and 310 2. Comparison circuit 320 is capable of comparing with each other the signals received on its inputs 322 1 and 322 2. Preferably, the comparison circuit is capable of comparing with each other the potentials received on its inputs 322 1 and 322 2. For this purpose, the comparison circuit is preferably a comparator, for example having commercial reference AD8561. As a variant, the comparison circuit is a comparator-assembled operational amplifier.

One at least of sensors 310-1 and 301-2 is an active circuit. A sensor is called active circuit when it has at least one power supply terminal distinct from its inputs, that is, not directly connected to one or the inputs. Power supply terminal means that, in operation, the power supply terminal is coupled, preferably connected, to a power source 350 (PWR), and the sensor samples energy from the power source to operate without sampling this energy from the inputs. This sampling from the power source enables the sensor to deliver on its output, at least temporarily, a current that may be larger than a current received on its inputs. In other words, for a sensor outputting a voltage, the sensor enables to match the impedance between its input and its output, that is, it has a ratio of the output and input impedances smaller than the ratio of the voltage delivered by the sensor to the voltage across switch 210-1, 210-2.

Power source 350 delivers a DC voltage between two nodes VCC and REF of application of the DC voltage. As an example, the DC voltage has a value equal to approximately 3.3 V, for example, 3.3 V, or to approximately 5 V, for example, 5 V. For this purpose, as an example, the power source uses AC voltage VAC. Power source 350 is not described in detail, the described embodiments being compatible with usual power sources capable of outputting DC voltages used by circuits of a converter.

Preferably, the two sensors 310-1 and 301-2 are both active circuits. Thus, sensors 310-1 and 310-2 each have a first power supply terminal, respectively 318-1 and 318-2, distinct from the inputs, respectively 312 1, 314 1, and 312 2, 314 2, and coupled, preferably connected, to node VCC. Preferably, node VCC is common for the two sensors 310-1 and 310-2 and coupled, preferably connected, to the same power source 350. As a variant, nodes VCC are distinct for the two sensors 310-1 and 310-2, and the sensors may then be coupled to different power sources. Preferably, the potential of node VCC is greater than that of node REF.

Sensors 310-1 and 310-2 each have a second power supply terminal, respectively 319-1 and 319-2, coupled, preferably connected, to node REF. Preferably, node REF is common for both sensors. As a variant, for sensors coupled to different power sources, node REF may be distinct for the two sensors.

It could have been devised to only use passive sensors, for example, voltage sensors only comprising resistors, such as voltage dividers, to obtain signals from the voltages across the switches. These resistors would have slowed down the charge of a stray capacitance at the input of comparison circuit 320 and/or would have sampled, permanently, a current from the terminals of switches 210-1 and 210-2. As a comparison, the fact of providing for at least one of the sensors to be an active circuit enables, for a same input current, to charge the stray capacitance faster, and/or enables to decrease the current sampled by the sensor from the terminals of the switches. The fact of decreasing the sampled current enables to increase the power efficiency of the converter. As an example, the sensors have an input impedance greater than 1 MΩ. The input current of the sensors may be smaller than 0.5 mA, or even smaller than 0.1 mA. Further, as explained hereafter in relation with FIG. 5, the fact of more rapidly charging the input stray capacitance of the comparison circuit also enables to increase the power efficiency of the converter.

Preferably, the sensors are two active circuits having a same relationship between their input and their output, that is, output a same signal for a same voltage across the switches. In operation, comparison circuit 320 delivers on its output a result of the comparison between the voltages across switches 210-1 and 210-2. Thus, a state change of the result output by the comparison circuit occurs when the voltage across the series association of switches 210-1 and 201-2, in other words, the voltage across bidirectional switch 200, passes through the zero value.

Control circuit 302 further comprises a logic circuit 330 (DLC). Circuit 330 has an input 332 coupled, preferably connected, to the output of comparison circuit 320. Logic circuit 330 receives control signal S on another input 334. Logic circuit 330 is capable of outputting a signal 335, based on the result output by the comparison circuit and on control signal S. Preferably, control circuit 302 further comprises a driver circuit 340, DRV, receiving signal 335 and applying, according to signal 335, control signal 304 to switches 210-1 and 210-2. As a variant, logic circuit 330 directly applies control signal 304 to switches 210-1 and 210-2. In another variant, circuit 340 applies, according to signal 335, distinct control signals to distinct control terminals of the switches. In operation, circuits 330 and possibly 340 set the two switches 210-1 and 210-2 to the on state when a logic state change of the comparator output, that is, a state change of the result of the comparison between the voltages across switches 210-1 and 210-2 occurs.

Preferably, sensors 310-1 and 301-2, comparison circuit 320, logic circuit 330, and possible circuit 340, are referenced to the potential of common source terminal 252. This is obtained, preferably, by connecting node REF common to the sensors to common source terminal 252, and by coupling, preferably connecting, a terminal 324 of application of a low power supply potential of comparison circuit 320 to common node REF. More preferably, circuits 330 and possibly 340 also have terminals of application of a lower power supply potential connected to node REF. As a variant, node REF has a fixed potential referenced to the potential of common source terminal 252, that is, a potential having a constant potential difference with that of the common source terminal. This fixed potential is for example smaller than the potential of common source terminal 252.

Thus, preferably, the signals output by the sensors, the result of the comparison output by comparison circuit 320, and the signal 335 output by the logic circuit, are referenced to the potential of common source terminal 252. In a variant, the signals and comparison results are referenced to one or a plurality of other potentials, for example, that of one of the drain terminals 262-1 and 262-1 of switches 210-1 and 210-2. However, as compared with such a variant, the signal 335 output by logic circuit 330, and control signal 340, are at the potential level enabling to simultaneously control the two switches 210-1 and 210-2, without requiring adapting the potential level. This is all the more advantageous as the voltage between drain 262-1, 262-2 and source 252 terminals alternately takes, at the switching frequency, the high values defined hereabove and substantially zero values with respect to these high values. The implementation issues of such a potential level matching are thus avoided, as well as the delays in the application of control signal 304 that would result from the potential level matching.

Preferably, control circuit 302 is a monolithic circuit, for example, located in a same package. More preferably, the control circuits 302 coupled to the bidirectional switches of a same H bridge or of a same H bridge branch are comprised in a same monolithic integrated circuit, for example, located in a same package. The integrated circuit thus comprises one or a plurality of, preferably two or four, control circuits 302. Such a monolithic circuit has, as compared with a non-monolithic circuit, the advantage of being capable of being connected or coupled to a bidirectional switch, to an H bridge branch, or to a monolithic H bridge, in a simpler and closer way, thus less likely to be disturbed by interference.

Figure 4:
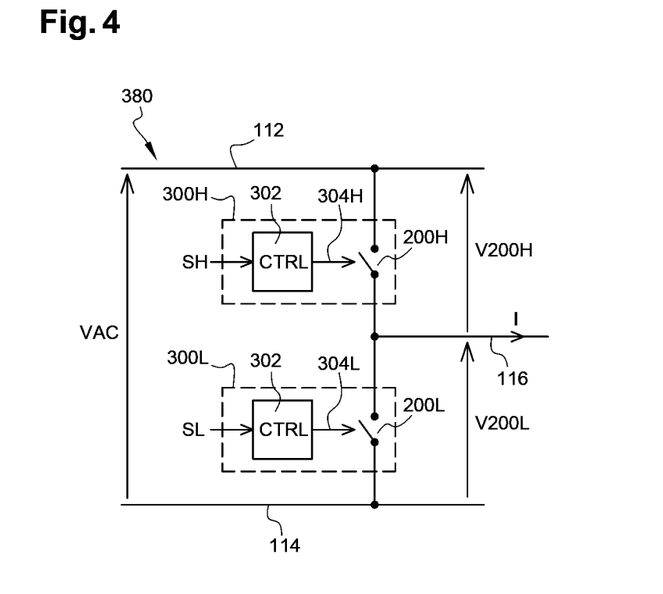
FIG. 4 schematically shows an embodiment of a converter branch.

FIG. 4 schematically shows an embodiment of a converter branch 380 comprising, electrically in series, a first bidirectional switch 200H and a second bidirectional switch 200L. In the example of a converter such as that in FIG. 1, branch 380 may replace branch 1A and/or branch 1B (FIG. 1). First and second bidirectional switches 200H and 200L then form the respective switches TA1H and TA1L of branch A1 or the respective switches TB1H and TB1L of branch BL. In this example, branch 380 then receives AC voltage VAC (FIG. 1) between terminals 112 and 114 of the branch. Branch 380 exhibits voltages V200H and V200L across the respective bidirectional switches 200H and 200L. Branch 380 delivers a current I on a node 116 of connection between bidirectional switches 200H and 200L.

Bidirectional switches 200H and 200L are preferably each formed by the switch 200 (FIG. 3) of a respective device 300H, 300L of the type of the device 300 of FIG. 3. Devices 300H and 300L are preferably identical, to within manufacturing dispersions. Devices 300H and 300L are identical or similar to the device 300 of FIG. 3, with the difference that they receive respective signals SH and SL different from each other playing the role of signal S of device 300. In operation, the circuits 302 (FIG. 3) for controlling (CTRL) devices 300H, 300L output respective control signals 304H and 304L, different from each other, playing the role of control signal 304 of device 300. For example, signals SH and SL are representative of desired states of respective switches TA1H and TA1L of branch A1 or of respective switches TB1H and TB1L of branch B1. Signals SH and SL may be obtained by any usual circuit, not shown, configured to output signals for controlling switches of a converter branch. The potential of node REF (FIG. 3) may further be different in devices 300H and 300L.

Figure 5:
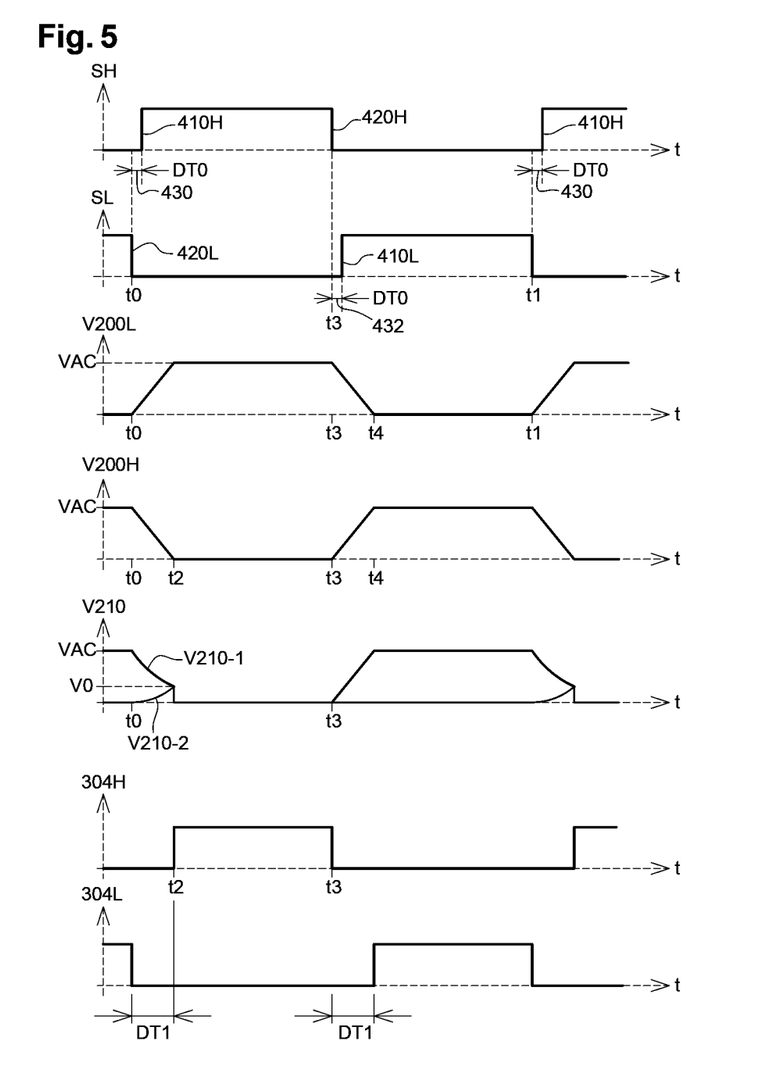
FIG. 5 shows in simplified timing diagrams an embodiment of a method implemented by the branch of FIG. 4.

FIG. 5 shows, in simplified timing diagrams, an embodiment of a method implemented by the branch of FIG. 4. More particularly, simplified curves according to time t have been shown:
 for control signal SH;
 for control signal SL;
 for the voltage V200L across second bidirectional switch 200L;
 for the voltage V200H across first bidirectional switch 200H;
 for the voltages V210 (V210 1 and V210 2) across respective switches 210-1 and 201-2 (FIG. 3) in first bidirectional switch 200H;
 for the control 304H of first bidirectional switch 200H; and
 for the control 304L of second bidirectional switch 200L.

The shown duration encompasses a switching cycle between two edges, for example, falling, 420L of signal SL at times t0 and t1. Signal SL comprises, between falling edges 420L, a rising edge 410L. Signal SH successively comprises a rising edge 410H and a falling edge 420H in each cycle. The duty cycle, defined by the ratio of the time for which signal SH or SL is at a given level, for example, a high level, to the time of a switching cycle, is preferably equal to approximately 0.5, for example, equal to 0.5. Voltage VAC, applied across the branch (between nodes 112 and 114, FIG. 4), does not substantially vary during the switching cycle.

At the end of the switching cycle preceding time t0, first bidirectional switch 200H is off and second bidirectional switch 200L is on. This is obtained by the setting of control signal 304H to a first level, for example, a low level, and the setting of control signal 304L, for example, to a high level. Voltage V200L is substantially zero, and voltage V200H has substantially the value of AC voltage VAC. In the first bidirectional switch 200H, AC voltage VAC is substantially applied between the drain and the source of a single one of switches 210 1 and 210 2 (FIG. 3), for example, switch 210 1. Thus, voltage V210 1 has a value in the order of that of AC voltage VAC, while voltage V210 2 is substantially zero.

At time t0, the edge 420L of signal SL causes a state change of control signal 304L and thus blocks the second bidirectional switch. The edge 410H of signal SH preferably occurs at the end of a delay 430 having a duration DT0 starting at time t0. During delay 430, the two signals SH and SL are simultaneously in the low state. The logic circuit 330 of device 300H receives rising edge 410H. Edge 410H causes, as described hereafter, the setting of control signal 304H to a second level (for example, the high level) by logic circuit 330 after a dead time DT1 starting at time t0. Edge 401H then forms a signal for setting control signal 304H to the high level, and may be replaced with any signal for setting control signal 304H to the second level. Dead time means a period during which the first and second bidirectional switches 200H and 200L are simultaneously off. Duration DT0 is preferably selected to be shorter than the duration of dead time DT1.

After time t0, the current I (FIG. 4) supplied by branch 380, for example, flowing through an inductance (140, FIG. 1) discharges capacitive element 118 (FIG. 1) electrically in parallel with the first bidirectional switch, and capacitive element 118 in parallel with the second bidirectional switch. In the first bidirectional switch, each of switches 210-1 and 210-2 (FIG. 3), in the off state, behaves as a capacitive element. Switch 210-1 discharges and switch 210-2 charges. As long as voltage V210-1 is greater than voltage V210-2, the comparison between these voltages provides the same result as at time t0. Control signal 304H is remains at the first level, in other words, in device 300H, the signal 335 (FIG. 3) output by logic circuit 330 is such that control signal 304H is maintained at the first level.

At a time t2, the result of the comparison changes. This occurs when voltages V210-1 and V210-2 are equal. Voltages V210-1 and V210-2 have, at time t2, a common value VO. For a value of AC voltage VAC for example equal to approximately 325 V, value VO is typically in the order of 55 V. As compared with a variant where node REF has a negative fixed potential referenced to the potential of common source terminal 252, the fact of providing for sensors 310-1 and 301-2 and comparison circuit 320 (FIG. 3) to be powered between node VCC of application of a positive potential and node REF connected to common source terminal 252 enables to simplify the comparison of these positive voltages.

In device 300H, logic circuit 330 is configured so that, at time t2, the state change of the output of comparison circuit 320 causes the switching of control signal 304H to the second level. This causes the setting to the on state of first bidirectional switch 200H.

As compared with a device where the sensors would not be active circuits, the fact for one at least of the, preferably each of the two, sensors 310-1 and 310-2 is an active circuit, decreases a delay (not shown) between time t2 and the switching of control signal 304H to the second level. Indeed, this delay is at least partly due to the charging time of the input stray capacitances of the control circuit. As an example, a delay between time t2 and the setting to the on state of first bidirectional switch 200H smaller than 25 ns, or even smaller than 5 ns, can be obtained. As compared with a longer delay, the possibility for the voltage across first bidirectional switch 200H to increase again, in absolute value, after its becoming zero at time t2, is decreased. Energy losses in the bidirectional switch are thus minimized during the switching.

As an example, in the case of an AC-DC converter for the delivery of a 100-W power at the USB-PD standard, a conversion power efficiency greater than 99.2%, or even greater than 99.6%, can be obtained. In particular, the converter may then have a heating level linked to energy losses, smaller than 1.9 W/cm$^3$ (35 W/inch$^3$). This enables to place the converter inside of a wall socket without having trouble discharging the generated heat.

Further, the decrease of the delay between time t2 and the setting to the on state of first bidirectional switch 200H enables to limit the harmonics level generated by the converter. This eases the conformity of the converter with maximum admissible levels of harmonics level, in particular when the power exceeds approximately 70 W.

After time t2, control signal 304H remains at the second level until a time t3 when logic circuit 330 (FIG. 3) receives a signal for setting control signal 304H to the first level, here, the falling edge 420H of signal SH. At time t3, control signal 304H switches to the first level. This causes the setting of first bidirectional switch 200H to the off state at time 3. The rising edge 410K of signal SL occurs afterwards, at the end of a delay 432 starting at time t3 and preferably having the same duration DT0 as delay 430. Preferably, voltages V200L and V200H vary between time t3 and a time t4 similarly to the respective voltages V200H and V200L between times t0 and t2. Second bidirectional switch 200L is set to the on state (control signal 304L set to the high level) at time t4 after a dead time period DT1 starting at time 3, at the time when the voltage across the second bidirectional switch has a zero or substantially zero value. Voltages V210-1 and V210-2 return to the values substantially equal to respectively VAC and 0 that they had before time t0.

In the above-described cycle, bidirectional switches 200H and 200L are simultaneously in the off state between times t0 and t2, and between times t3 and t4. Dead time DT1 has thus been obtained. The fact of providing dead time DT1 enables to avoid any risk of shorting the branch. Such a shorting might damage the converter and/or decrease its reliability.

According to an advantage, the dead time DT1 thus obtained is both sufficiently long to decrease the risk for a current to simultaneously flow through the two bidirectional switches of the branch, and sufficiently short to decrease the risk for a current to start flowing, for example, through a diode formed of the semiconductors of one or the other of switches 210-1, 210-2, each forming bidirectional switches 200H and 200L. Such currents would increase the power consumption of the converter. The dead time DT1 obtained in the present embodiment thus has an optimal duration allowing, at the same time, a particularly high power efficiency, and an increase in the reliability of the converter while avoiding shorting risks. The obtained dead time DT1 has the additional advantage of varying when the operating parameters, such as the input voltage, vary, so that the duration of dead time DT1 remains optimal for all or most operating parameters of the converter.

The delays 430 and 432 provided in the above example also enable to limit shorting risks. Duration DT0 may be defined according to the elements selected to generate the signal and/or according to the properties of the logic circuits 330 (FIG. 3) of the bidirectional switch control devices.

According to an embodiment, delays 430 and 432 are omitted (in other words, duration DT0 is zero or substantially zero). In other words, signals SH and SL are inverse to each other. The two bidirectional switches of the branch may then advantageously be controlled from a single one of signals SH and SL, for example, corresponding to signal S (FIG. 3), the other one of signals SH and SL being obtained by means of an inverter, for example, receiving signal SH and outputting signal SL. More generally, signals SH and SL may be output by any circuit enabling to obtain two opposite signals with a single signal. This enables to particularly simply obtain signals SH and SL. In the case where the potential of node REF (FIG. 3) is different in the two devices 300H and 300L, signals SH and SL may be applied to the respective devices 300H and 300L by any usual circuit for transmitting signals SH and SL between circuits referenced to different potential levels.

Figure 6:
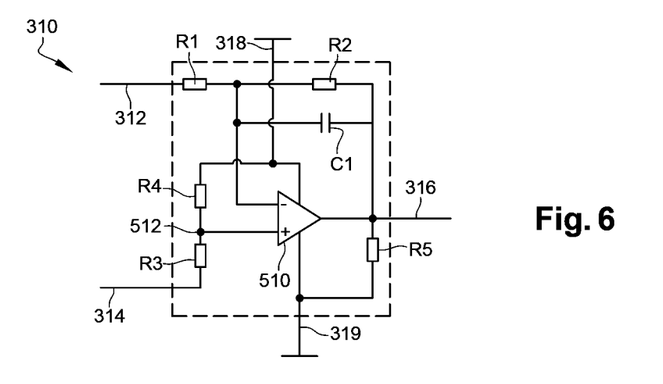
FIG. 6 schematically shows an embodiment of a sensor of the device of FIG. 3.

FIG. 6 schematically shows an embodiment of a sensor 310. Sensor 310 may form one and/or the other of sensors 310-1 and 310-2 of the control circuit 302 of FIG. 3.

Sensor 310 comprises an operational amplifier 510. Amplifier 510 has power supply terminals coupled, preferably connected to the power supply terminals 318 and 319 of sensor 310. The output of the amplifier is coupled, preferably connected, to output 316 of the sensor. As an example, the amplifier is of the type known under commercial reference OPA859.

Sensor 310 comprises a first resistor, R1, coupling an inverting input of amplifier 510 to an input 312 of the sensor. Resistor R1 has a value for example in the order of 2.2 MD.

Sensor 310 comprises a second resistor, R2, coupling the inverting input of amplifier 510 to an output of amplifier 510. Resistor R2 has a value for example in the order of 500Ω.

Preferably, sensor 310 comprises a capacitor C1 electrically in parallel with second resistor R2. As an example, capacitor C1 has a value in the order of from 5 pF to 10 pF. Capacitor C1 enables to improve the stability of the operation of amplifier 510.

Preferably, sensor 310 further comprises a resistor R5 coupling the output of the amplifier to power supply terminal 319. Resistor R5 has a value for example in the order of 100 kW. Resistor R5 enables to improve the stability of the operation of amplifier 510. Resistor R5 may be omitted.

Amplifier 510 has a non-inverting input coupled, preferably connected, to a node 512. Node 512 connects resistors R3 and R4 electrically in series between an input 314 (connected to source terminal 252) and terminal 318 (connected to node VCC). As an example, resistors R3 and R4 have values in the order of 1 kΩ. Thus, node 512 is a node of application of a fixed potential with respect to that of source terminal 252. Preferably, as in the shown example, this potential is positive.

In a variant, resistors R3 and R4 are omitted, and node 512 is coupled, preferably connected, to input 314. In this variant, so that the output signal of the sensor can take negative values, amplifier 510 is powered between a positive potential applied to terminal 318 and a negative potential applied to terminal 319, these potentials being referenced to that of source terminal 252. However, as compared with such a variant, the positive fixed potential applied to node 512 causes a constant offset in the relationship between the input and the output of the sensor. In other words, the output voltage of the sensor is not zero when the voltage across the concerned switch 210-1, 210-2 is zero. Such a constant offset enables to obtain a positive sensor output voltage for the entire range of values of the voltage across the concerned switch 210-1, 210-2. Amplifier 510 may thus be powered between a positive potential applied to terminal 318 and the reference potential of source terminal 252. Thus, as compared with a sensor with no constant offset, the constant offset enables to simplify the power supply of sensor 310.

The constant offset may be obtained by any circuit enabling to obtain a constant offset in the relationship between the input and the output of the sensor. In particular, node 512 may be any node outputting a positive fixed potential referenced to the potential of source terminal 252. The nodes 512 of sensors 310-1 and 310-2 may be distinct, or node 512 may be common to sensors 310-1 and 310-2.

A voltage sensor has been described hereabove with a specific example of active circuit. This example is not limiting, the voltage sensor being capable of being formed by any active circuit capable of outputting a signal from the voltage across a switch.

Figure 7:
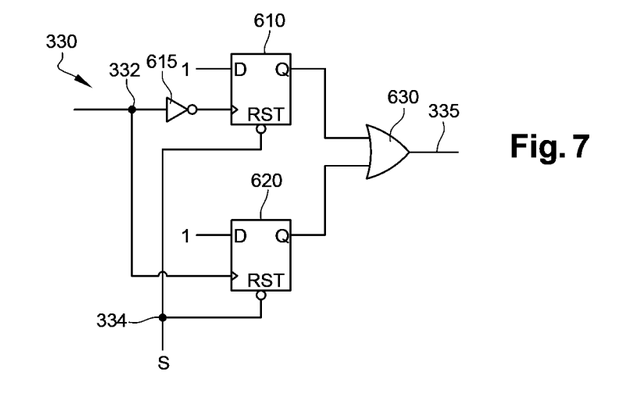
FIG. 7 schematically shows an embodiment of a logic circuit of the device of FIG. 3.

FIG. 7 schematically shows an embodiment of the logic circuit 330 of the device of FIG. 3.

Logic circuit 330 comprises two flip-flops 610 and 620. Each flip-flop has as a data input (D) receiving a high logic level ("1"). Each flip-flop has a reset input (RST) connected to input 334 of circuit 330. The reset input is configured so that, when the signal received on this input has a low level, an output (Q) of the flip-flop is set to zero. Flip-flop 610 has a synchronization or clock input coupled, preferably connected, to the output of an inverter 615 having its input coupled, preferably connected, to the input 332 of circuit 330. Flip-flop 620 has a synchronization input coupled, preferably connected, to the input 332 of logic circuit 330. Circuit 330 further comprises an OR logic gate 630 having an input coupled to the output (Q) of flip-flop 610 and another input coupled to the output (Q) of flip-flop 620. Logic OR gate 630 delivers, on its output, signal 335.

In operation, when signal S is at the low logic level, signal 335 is at the low logic level. When signal S is at the high logic level, signal 335 remains at the low logic level until an edge output by comparison circuit 320 reaches input 332. The edge causes the switching of signal 335 to the high logic level. Signal 335 then remains at the high logic level as long as signal S is at the high logic level. The edge may be rising or falling. The fact of providing this switching of signal 335 to the high logic level for both directions, rising and falling, of the edges enables to obtain an operation similar to that described in relation with FIG. 5 for both directions of AC voltage VAC.

Various embodiments and variants have been described. Those skilled in the art will understand that certain features of these embodiments can be combined and other variants will readily occur to those skilled in the art.

Finally, the practical implementation of the described embodiments and variations is within the abilities of those skilled in the art based on the functional indications given hereabove.

What is claimed is:

1. A circuit for controlling two switches electrically in series, comprising sensors of voltage across the switches and a circuit of comparison of signals output by said sensors, one at least of said sensors being an active circuit that provides an output signal that varies continuously when voltage across a corresponding switch varies, wherein each sensor comprises:
   an amplifier having a non-inverting input coupled to a first node of application of a potential fixed with respect to the potential of the common source terminal;
   a first resistor coupling an inverting input of the amplifier to a drain terminal of one of said transistors; and
   a second resistor coupling the inverting input of an output of the amplifier,
   wherein said switches comprise field-effect transistors of the same type having a common source terminal,
   the circuit for controlling being capable of delivering a control signal, according to a result output by the comparison circuit, to a control terminal common to said switches.

2. The circuit according to claim 1, configured to switch the control signal from a first level to a second level when a state change of said result occurs.

3. The circuit according to claim 2, configured to:
   receive an additional signal;
   maintain the control signal at the first level between said reception and said state change; and
   maintain the control signal at the second level between said state change and a reception of another additional signal.

4. The circuit according to claim 1, wherein said voltages are across the respective switches, and said sensors are two active circuits having a same relationship between the input and the output.

5. The circuit according to claim 4, wherein said relationship comprises a constant offset.

6. The circuit according to claim 1, wherein said switches are of GaN HEMT type.

7. The circuit according to claim 1, wherein the signals output by said sensors are referenced to the potential of the common source terminal.

8. The circuit according to claim 1, wherein the first node is common to the sensors or the first nodes are distinct, the or each first node connects third and fourth resistors electrically in series between the common source terminal and a second node of application of an additional voltage referenced to the common source terminal.

9. A method of controlling the two switches electrically in series, implemented by the circuit according to claim 1.

10. The method according to claim 9, comprising the outputting of said signals by said sensors and the comparison of said signals with each other by said comparison circuit.

11. An integrated circuit comprising the circuit for controlling or a plurality of circuits for controlling according to claim 1.

12. A device comprising integrated circuit according to claim 11, and said switches.

13. A switched-mode converter comprising one or a plurality of devices according to claim 12.

14. The converter according to claim 13, configured to receive and/or to output an AC voltage, comprising two bidirectional switches each formed of the two switches of one of said devices, the two bidirectional switches being electrically in series between two nodes of application of the AC voltage.

* * * * *